US010109598B2

(12) United States Patent
Hu (10) Patent No.: US 10,109,598 B2
(45) Date of Patent: Oct. 23, 2018

(54) COMPOSITE CARRIER FOR WARPAGE MANAGEMENT (71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 15/050,062

(22) Filed: Feb. 22, 2016

(65) Prior Publication Data
US 2016/0254233 A1 Sep. 1, 2016

Related U.S. Application Data (60) Provisional application No. 62/121,838, filed on Feb. 27, 2015.

(51) Int. Cl.
*B32B 7/02* (2006.01)
*H01L 23/00* (2006.01)
(Continued)

(52) U.S. Cl.
CPC ............ *H01L 23/562* (2013.01); *B32B 7/02* (2013.01); *B32B 7/12* (2013.01); *H01L 21/486* (2013.01); *H01L 21/4857* (2013.01); *H01L 21/6835* (2013.01); *H01L 23/49822* (2013.01); *H01L 23/49827* (2013.01); *H05K 3/4682* (2013.01);
(Continued)

(58) Field of Classification Search
CPC ............ H01L 23/562; H01L 21/6835; H01L 2221/68304–2221/68395; H01L 2224/82001–2224/82005; H01L 21/568; H05K 3/007; H05K 3/0097; H05K 2203/0152; H05K 2203/0156; H05K 2203/016; H05K 3/4682;
(Continued)

(56) References Cited

U.S. PATENT DOCUMENTS 4,901,476 A * 2/1990 Nagashima ....... B32B 17/10036
49/475.1
4,970,569 A * 11/1990 Mori ..................... C22C 19/00
257/677
(Continued)

FOREIGN PATENT DOCUMENTS

JP 11207585 A * 8/1999
JP WO 2012133638 A1 * 10/2012 ............. H05K 3/022
(Continued)

OTHER PUBLICATIONS

Property of Silicon from MEMSnet. Retrieved from https://www.memsnet.org/material/siliconsibulk/ on Dec. 7, 2017.*
(Continued)

*Primary Examiner* — Z. Jim Yang
(74) *Attorney, Agent, or Firm* — JCIPRNET (57) ABSTRACT

A composite carrier is disclosed for warpage management as a temporary carrier in semiconductor process. Warpage is reduced for a product, semi-product, or build-up layer processed on the temporary composite carrier which is peeled off the temporary carrier in a later step. The composite carrier comprises a top substrate and a bottom substrate, an adhesive layer is configured in between the top substrate and a bottom substrate. One of the embodiments discloses the top substrate of the composite carrier having a lower CTE and the bottom substrate of the composite carrier having a higher CTE.

14 Claims, 8 Drawing Sheets

(51) Int. Cl.
*H01L 21/683* (2006.01)
*B32B 7/12* (2006.01)
*H01L 23/498* (2006.01)
*H01L 21/48* (2006.01)
*H05K 3/46* (2006.01)
*H05K 3/00* (2006.01)

(52) U.S. Cl.
CPC ............... *H01L 2221/68345* (2013.01); *H01L 2221/68359* (2013.01); *H05K 3/007* (2013.01); *H05K 2201/068* (2013.01); *H05K 2201/09136* (2013.01); *Y10T 428/24777* (2015.01)

(58) Field of Classification Search
CPC ..... Y10T 428/24488; Y10T 428/24777; B32B 3/02–3/08; B32B 1/04
USPC .................................................. 428/156, 192
See application file for complete search history.

(56) References Cited

U.S. PATENT DOCUMENTS

| | | | | |
|---|---|---|---|---|
| 5,231,751 A * | 8/1993 | Sachdev | ............... | H01L 21/486 216/18 |
| 5,422,058 A * | 6/1995 | Okamoto | ............ | B29C 45/0053 156/107 |
| 5,779,870 A * | 7/1998 | Seip | ........................ | H05K 3/025 156/151 |
| 6,321,569 B1 * | 11/2001 | Sreeram | ..................... | H01J 9/20 65/42 |
| 6,391,743 B1 * | 5/2002 | Iwane | ............... | H01L 21/67092 136/243 |
| 6,436,226 B1 * | 8/2002 | Omi | ......................... | B26F 3/004 156/239 |
| 6,908,828 B2 * | 6/2005 | Letertre | .............. | H01L 21/2007 257/E21.122 |
| 8,893,378 B2 | 11/2014 | Horng | | |
| 2003/0017647 A1 * | 1/2003 | Kwon | .................... | H01L 21/568 438/109 |
| 2003/0097745 A1 * | 5/2003 | Okamoto | ............. | G02B 6/3833 29/458 |
| 2004/0079941 A1 * | 4/2004 | Yamazaki | ............ | H01L 27/1218 257/40 |
| 2004/0140547 A1 * | 7/2004 | Yamazaki | ............ | H01L 21/6835 257/686 |
| 2004/0242003 A1 * | 12/2004 | Murayama | ............... | B24B 7/228 438/690 |
| 2007/0004211 A1 * | 1/2007 | Kim | .................... | H01L 21/0209 438/692 |
| 2007/0246744 A1 * | 10/2007 | Chen | ................... | H01L 21/4857 257/211 |
| 2008/0079157 A1 * | 4/2008 | Kurita | ................. | H01L 21/4857 257/753 |
| 2009/0086350 A1 * | 4/2009 | Garzon | ................ | G02B 7/1827 359/871 |
| 2009/0107703 A1 * | 4/2009 | Abe | .................. | H01L 23/49822 174/254 |
| 2009/0200543 A1 * | 8/2009 | Kerr | .................... | H01L 21/6835 257/40 |
| 2009/0252931 A1 * | 10/2009 | Jeng | ...................... | B29C 70/763 428/192 |
| 2011/0003619 A1 * | 1/2011 | Fujii | ...................... | C03C 3/083 455/566 |
| 2011/0104426 A1 * | 5/2011 | Farooq | .................. | H01L 25/074 428/64.1 |
| 2012/0223455 A1 * | 9/2012 | Shintani | ................ | H01L 51/003 264/234 |
| 2012/0295415 A1 * | 11/2012 | Ono | .................. | H01L 21/76898 438/455 |
| 2013/0075365 A1 * | 3/2013 | Fournel | ................... | H01L 21/67 216/54 |
| 2013/0143062 A1 * | 6/2013 | Kaneko | .................. | B32B 38/10 428/614 |
| 2013/0328174 A1 * | 12/2013 | La Tulipe, Jr. | ......... | H01L 25/50 257/629 |
| 2014/0054259 A1 * | 2/2014 | Tateoka | ................. | H05K 3/022 216/13 |
| 2014/0057391 A1 * | 2/2014 | Lin | ......................... | H01L 21/56 438/107 |
| 2014/0115889 A1 * | 5/2014 | Lin | ..................... | H05K 3/4682 29/849 |
| 2015/0110991 A1 * | 4/2015 | Miwa | .................... | C03B 33/076 428/77 |
| 2015/0183179 A1 * | 7/2015 | Frank | ................. | B22D 19/0081 428/192 |
| 2015/0206938 A1 * | 7/2015 | Rossini | ............... | H01L 21/2007 428/426 |
| 2015/0228622 A1 * | 8/2015 | Koyanagi | ......... | H01L 23/49838 257/777 |
| 2015/0328875 A1 * | 11/2015 | Hattori | .................... | B32B 38/10 310/313 R |
| 2015/0373842 A1 * | 12/2015 | Min | ........................ | H05K 1/02 428/47 |
| 2015/0380291 A1 * | 12/2015 | Nakajima | ........... | H01L 21/6835 438/759 |
| 2016/0005637 A1 * | 1/2016 | Woodard | ............... | B23Q 3/084 156/758 |
| 2016/0093546 A1 * | 3/2016 | Pai | ......................... | H01L 23/13 438/126 |
| 2016/0104620 A1 * | 4/2016 | Kurokawa | ........ | H01L 21/76251 438/457 |
| 2016/0358805 A1 * | 12/2016 | Broekaart | ........... | H01L 21/6835 |

FOREIGN PATENT DOCUMENTS

JP WO 2012157610 A1 * 11/2012 ........... C03B 33/076
WO WO-2013098530 A1 * 7/2013 ......... H01L 21/2007

OTHER PUBLICATIONS

Young's Modulus of Fine Ceramics from Kyocera. Retrieved from https://global.kyocera.com/prdct/fc/list/tokusei/gousei/index.html on Dec. 7, 2017.*

* cited by examiner

COMPOSITE CARRIER FOR WARPAGE MANAGEMENT

RELATED APPLICATIONS

The present application claims the benefit of U.S. Provisional Application No. 62/121,838, filed Feb. 27, 2015, the disclosure of which is hereby incorporated by reference herein in its entirety.

BACKGROUND

Technical Field

The present invention relates to a temporary carrier used in a semiconductor process, especially for a composite carrier used as a temporary carrier for warpage management in a semiconductor process.

Description of Related Art

Figure 1A:
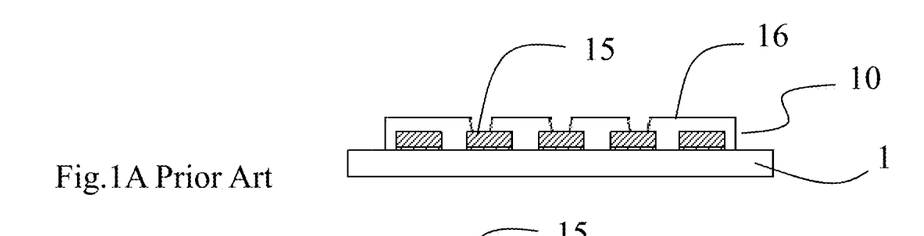
FIGS. 1A~1C show a prior art
Figure 1B:
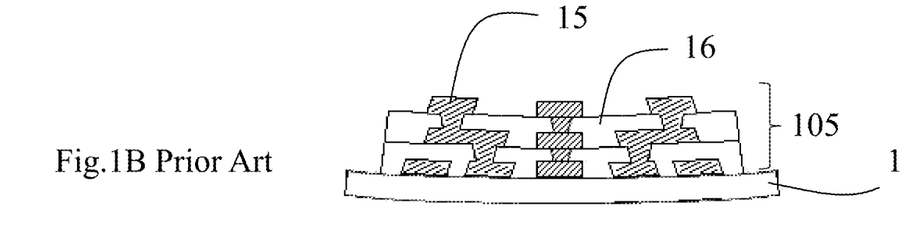
Figure 1C:
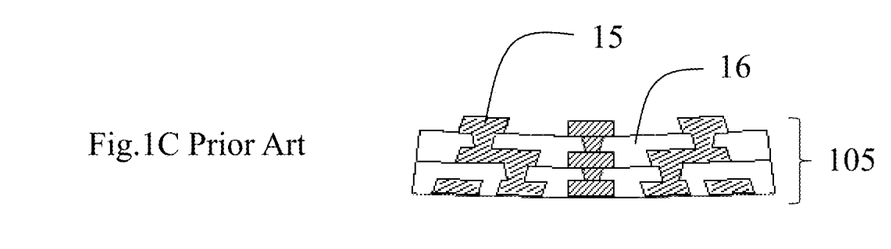

FIGS. 1A~1C Show a Prior Art

FIG. 1A shows that a build-up layer 10 is processed on top of a traditional carrier 1. The build-up layer process is taken as an example only. A different product or semi-product such as multi-chip package (not shown) can also be processed on top of the temporary carrier 1. In a later step, the processed product or semi-product is torn off the temporary carrier 1 for a further process.

FIG. 1B shows more build-up layers 10 have been made to form a second build-up layer 105. Both the carrier 1 and the build-up layer 105 experience expansion and shrinkage during semiconductor process, and warpage occurs due to a mismatch in Coefficient of Thermal Expansion (CTE) between the build-up layer 105 and the carrier 1.

FIG. 1C shows the build-up layer 10 detached from the carrier 1. The detached build-up layer 10 has been distorted. Such a distortion causes problems in registration in a later process for the product.

Figure 2:
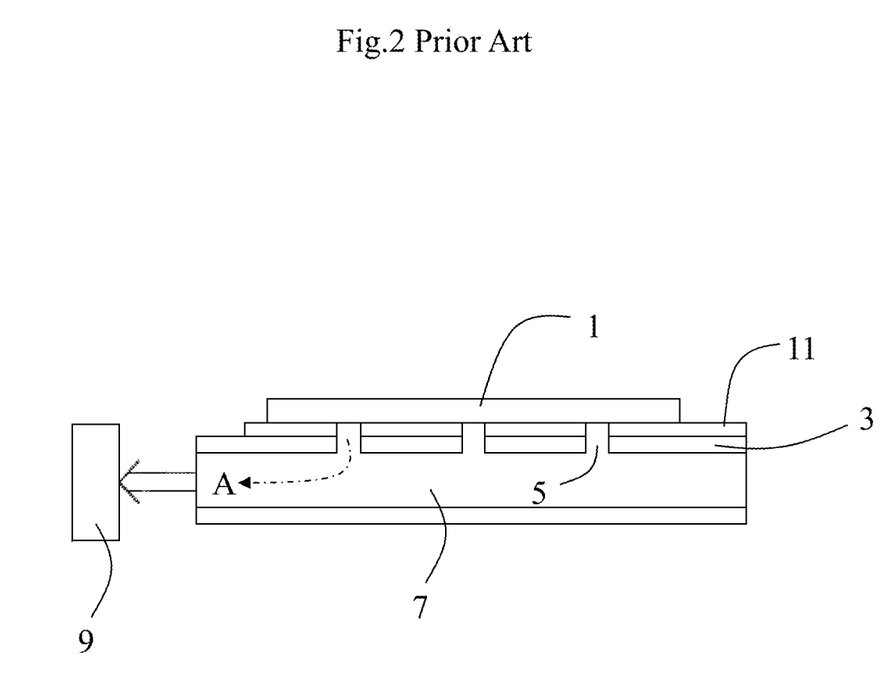
FIG. 2 shows a prior art

FIG. 2 Shows a Prior Art

FIG. 2 shows a prior art—U.S. Pat. No. 8,893,378, a temporary carrier 1 is sucked by a vacuum system to keep the temporary carrier 1 to be in a flat and from being distorted during semiconductor process with heating and cooling. A build-up layer, for example, can be processed on top of the temporary carrier 1. FIG. 2 shows that a cross-section view illustrating the principle of the prior art. A temporary carrier 1 is placed on an evacuable jig 3. The evacuable jig 3 has apertures Sand a gas passage 7. The gas passage 7 is coupled to an evacuation device 9 such as a vacuum pump. The vacuum pump 9 sucks to keep the temporary carrier 1 flat all the time during semiconductor process. The prior art system designed for overcoming the CTE mismatch problem is expensive and complicated because it needs at least an evacuation device 9 and a jig 3. The additional equipment occupies large space which is unacceptable for conventional equipment in semiconductor process. A simple and easy handling method or device compatible with current equipment for a temporary carrier's warpage management is a long desirable solution in semiconductor industry.

DETAILED DESCRIPTION OF THE INVENTION

A temporary composite carrier is disclosed for warpage management in semiconductor process according to the present invention. Warpage is reduced for a Product, semi-product, or build-up layer processed on top of the temporary composite carrier according to the present invention. The temporary composite carrier according to the present invention has a sandwich structure which comprises a top substrate, a bottom substrate, and an adhesive layer. The adhesive layer is configured in between the top substrate and a bottom substrate for combining the substrates tight together. One of the embodiments discloses that the top substrate has a lower CTE and the bottom substrate has a higher CTE.

A first advantage for the present invention is that the composite carrier is a safe carrier to prevent chamber contamination if breakage occurs. No debris or only very little debris shall come off to contaminate the chamber, because any debris from breakage of one or both of the substrates shall be adhered to the adhesive layer.

A second advantage for the present invention is that the temporary composite carrier has a top substrate and a bottom substrate which can be with different CTE. For example, the top substrate is made of a material with a relative lower CTE and the bottom substrate is made of a material with a relative higher CTE. When a product, semi-product, or build-up layer is processed on top of the top substrate and with a higher CTE relative to the top substrate of the composite carrier, a stress of the bottom substrate shall offset at least partial stress from the one processed on the top substrate to reduce warpage of the top substrate as well as the one processed on top.

A third advantage for the present invention is that the top substrate and the bottom substrate may choose different thickness for a better stress matching in a specific case. Because in most cases, a mismatch in mechanical properties, such as CTE, between a temporary carrier and a product processed on top of the temporary carrier always exists. Based on the adjustable thickness, in combination of different CTE chosen for either one of the two substrates according to the present invention, the temporary composite carrier can be tailored to minimize the stress and warpage of the total structure, especially of the product, semi-product, or build-up layer . . . etc., processed on top.

Figure 3A:
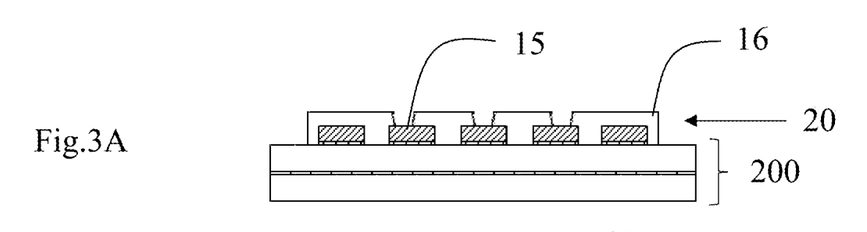
FIGS. 3A~3C show build-up layers processed on the composite carrier
Figure 3B:
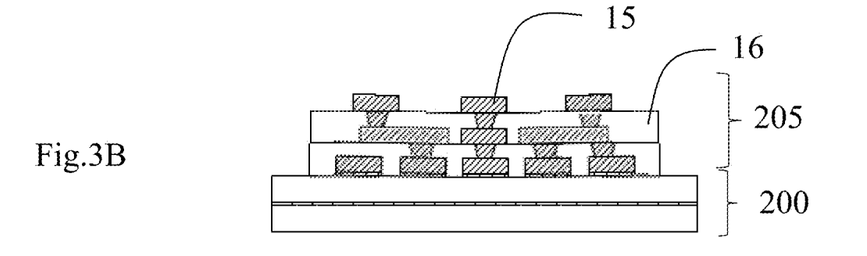
Figure 3C:
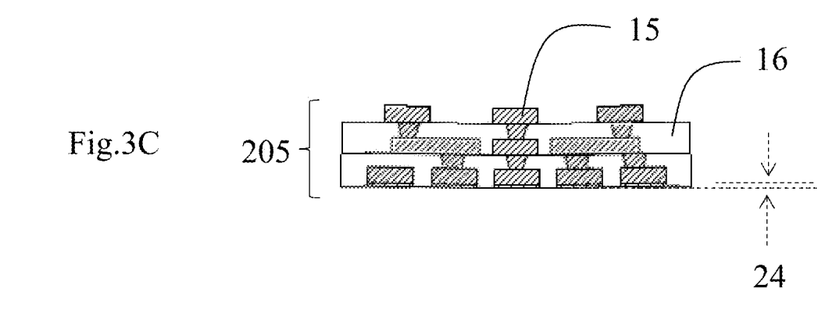

FIGS. 3A~3C Show Build-Up Layers Processed on the Composite Carrier

FIG. 3A shows a build-up layer 20 made on top of a top substrate of the composite carrier 200.

FIG. 3B shows more build-up layers 20 have been made to form a second build-up layer 205. The composite carrier 200 experiences shrinkage and warpage after thermal shock during semiconductor process and due to the CTE mismatch between the build-up layer 20 and the composite carrier 200. However, FIG. 3B shows only very little warpage due to a stress of the bottom substrate of the composite carrier 200.

Build-up layer is taken as an example. Copper line 15 in the build-up layer roughly has a CTE around 17 ppm, and dielectric layer 16 in the build-up layer such as one of Polybenzoxazole (PBO), Polyimide (PI), or Benzocyclobuten (BCB), roughly has a CTE around 30 ppm; in combination the build-up layer 205 roughly has a CTE around 20 ppm.

The bottom substrate 21B is made of a material having a CTE larger than a CTE of the top substrate 21T so that a stress from the bottom substrate is able to offset some stress of the build-up layer 205 on top so that the warpage of the build-up layer 205 is reduced before or after it being detached from the temporary composite carrier 200.

FIG. 3C shows the build-up layer 205 detached from the carrier 200. The detached build-up layer 205 has very little distortion as compared with the build-up layer 105 fabricated on a traditional carrier 1.

Further referring to FIG. 1C, compared with FIG. 1C, the traditional build-up layer 105 has a distortion as indicated as distance 24. The build-up layer 205 of FIG. 3C according to the present invention has significant less distortion than the traditional build-up layer 105 of FIG. 1C.

Figure 4A:
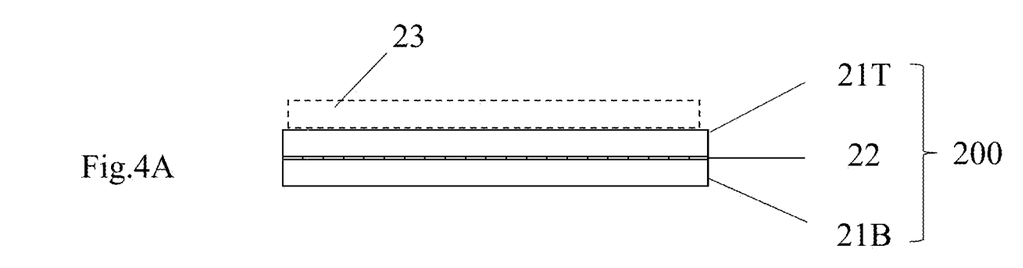
FIG. 4A shows a first embodiment of the composite carrier according to the present invention

FIG. 4A Shows a First Embodiment of the Composite Carrier According to the Present Invention FIG. 4 shows a composite carrier 200 which comprises a top substrate 21T, an adhesive layer 22 is configured on bottom of the top substrate 21T, and a bottom substrate 21B is configured on bottom of the adhesive layer 22. The top substrate 21T is made of a material selected from a group consisting of silicon, glass, copper clad laminate (CCL), silicon carbide (SiC), stainless steel, alloy 42, and ceramic including Aluminum Oxide (Al2O3, ~7 ppm), Aluminum Nitride (AlN, ~5 ppm), and Zirconia (ZrO2, ~10.5 ppm). The bottom substrate 21B is made of a material selected from a group consisting of silicon, glass, copper clad laminate (CCL), silicon carbide (SiC), stainless steel, alloy 42, and ceramic. A top area 23 of the top substrate 21T provides area for semiconductor process thereon.

No debris or only very little debris shall come off from the composite carrier 200 to contaminate the chamber, because any debris from breakage of one or both of the substrates of the composite carrier 200 shall adhere to the adhesive layer 22.

Figure 4B:
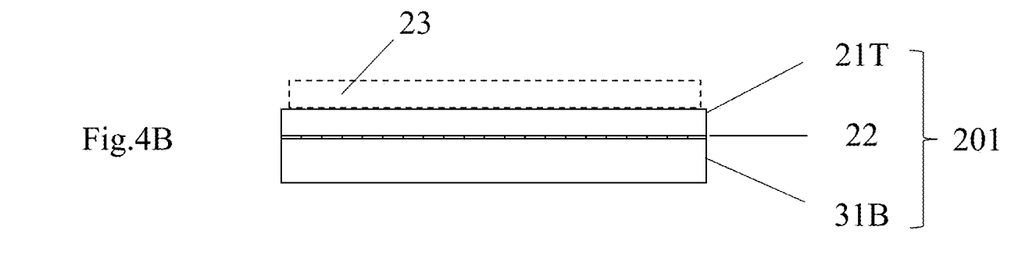
FIG. 4B shows a second embodiment of the composite carrier according to the present invention

FIG. 4B Shows a Second Embodiment of the Composite Carrier According to the Present Invention FIG. 4B shows that a composite carrier 201 has a top substrate 21T and a bottom substrate 31B. An adhesive layer is configured in between the top substrate 21T and the bottom substrate 31B. A thickness of the bottom substrate 31B is thicker than a thickness of the top substrate 21T. The higher thickness of the bottom substrate 31B provides higher stiffness to withstand the bending or distortion for the product being processed on top 23 of the top substrate 21T.

Figure 4C:
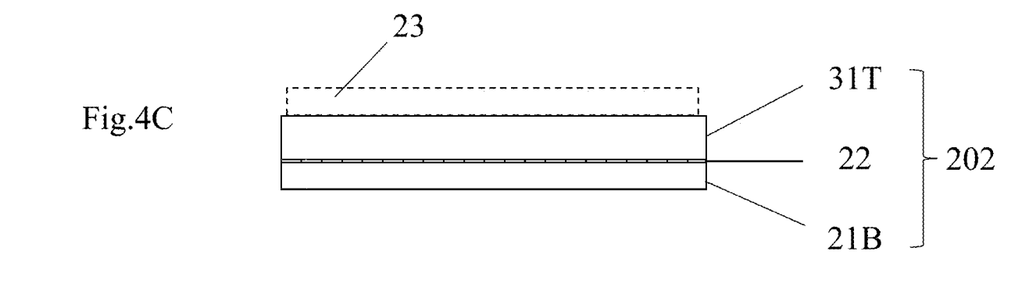
FIG. 4C shows a third embodiment of the composite carrier according to the present invention

FIG. 4C Shows a Third Embodiment of the Composite Carrier According to the Present Invention FIG. 4C shows that a composite carrier 202 has top substrate 31T and a bottom substrate 21B. A thickness of the top substrate 31T is thicker than a thickness of the bottom substrate 21B. The higher thickness of the top substrate 31T provides higher stiffness to withstand the bending or distortion for the product being processed on top 23 of the top substrate 31T.

Figure 5:
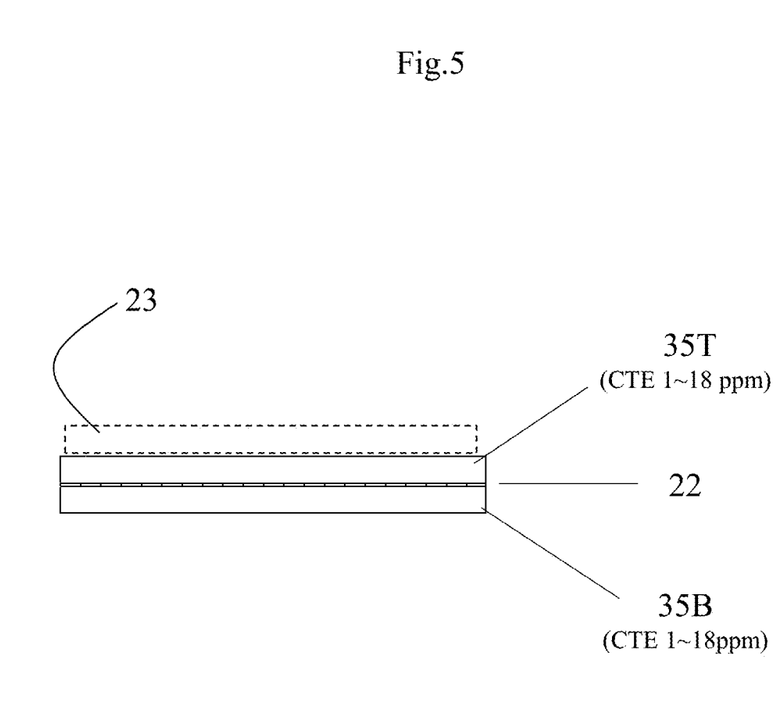
FIG. 5 shows a fourth embodiment of the composite carrier according to the present invention

FIG. 5 Shows a Fourth Embodiment of the Composite Carrier According to the Present Invention FIG. 5 shows a composite carrier for warpage management. FIG. 5 shows either one of the top substrate 35T or the bottom substrate 35B is made of a material having a CTE around 1~18 ppm. The material of the top substrate 35T can be the same as the material of the bottom substrate 35B. Alternatively, the material of the top substrate 35T can be different from the material of the bottom substrate 35B.

The material for the substrate can be used is one selected from the group consisting of:
Invar having a CTE around 1 ppm,
Aluminum Nitride having a CTE around 5 ppm,
Silicon having a CTE around 3 ppm,
Glass having a CTE around 4 ppm,
Alloy 42 having a CTE around 4.8 ppm,
Cemented Carbide having a CTE around 5.5 ppm,
Aluminum Oxide having a CTE around 7 ppm,
Alumina having a CTE around 7.2 ppm,
Titanium having a CTE around 8.6 ppm,
Zirconia having a CTE around 10.5 ppm,
Glass having a CTE around 0~10 ppm, and
Stainless Steel having a CTE around 10~18.0 ppm.

Figure 6:
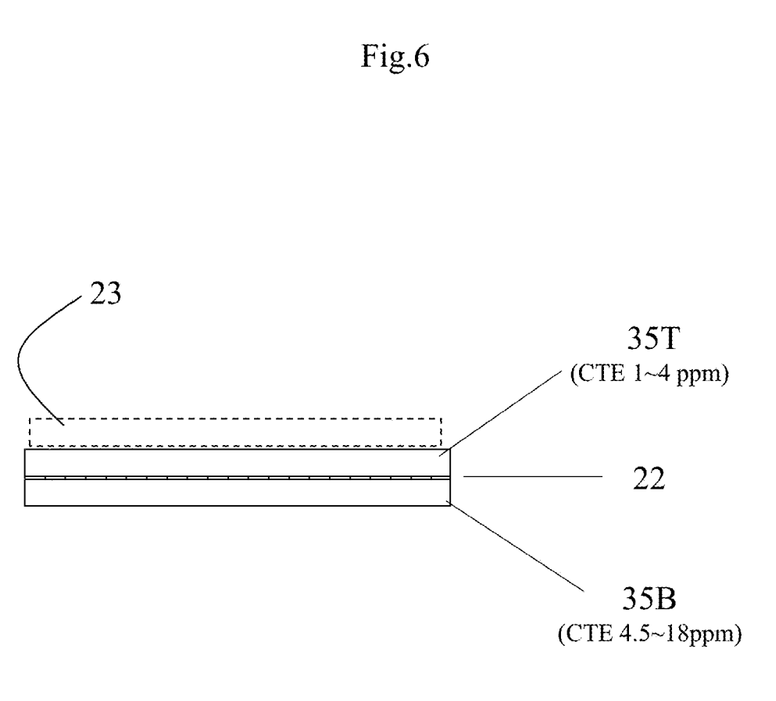
FIG. 6 shows a fifth embodiment of the composite carrier according to the present invention

FIG. 6 Shows a Fifth Embodiment of the Composite Carrier According to the Present Invention FIG. 6 shows that the material of the top substrate 35T is different from the material of the bottom substrate 35B. The material of the top substrate 35T is selected from a material having CTE from 1~4 ppm; and the material of the bottom substrate 35B is selected from a material having a CTE from 4.5~18 ppm.

Figure 7:
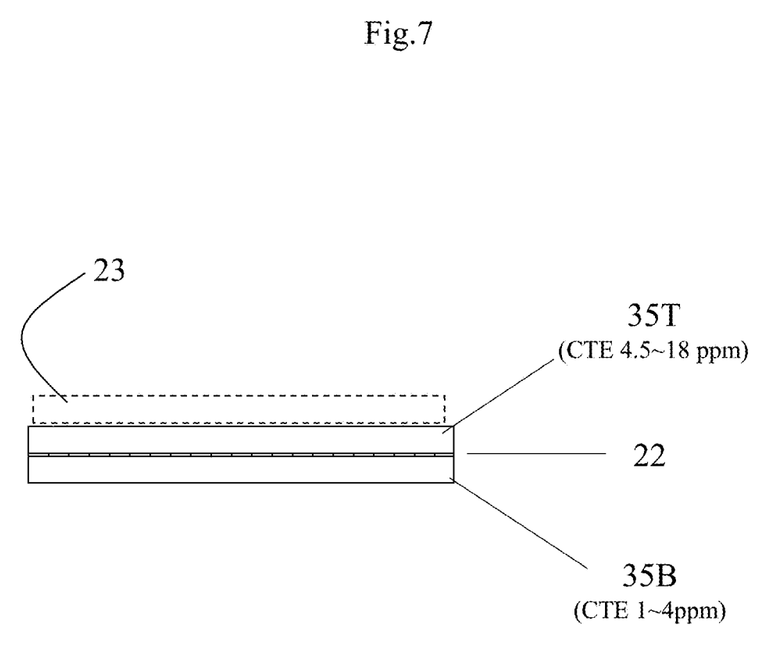
FIG. 7 shows a sixth embodiment of the composite carrier according to the present invention

FIG. 7 Shows a Sixth Embodiment of the Composite Carrier According to the Present Invention FIG. 7 shows that the material of the top substrate 35T is different from the material of the bottom substrate 35B. The material of the top substrate 35T is selected from a material having CTE from 4.5~18 ppm; and the material of the bottom substrate 35B is selected from a material having a CTE from 1~4 ppm.

Figure 8A:
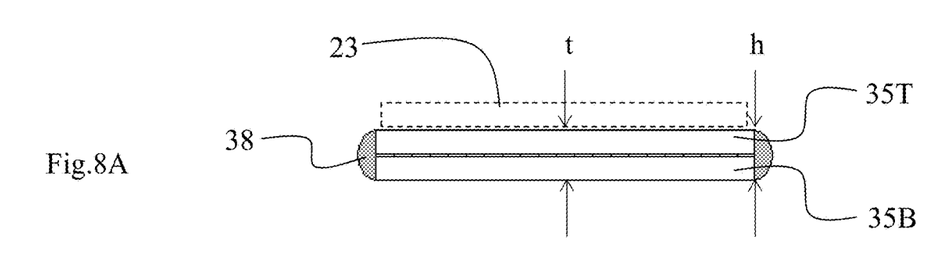
FIGS. 8A~8C show modified embodiments according to the present invention.
Figure 8B:
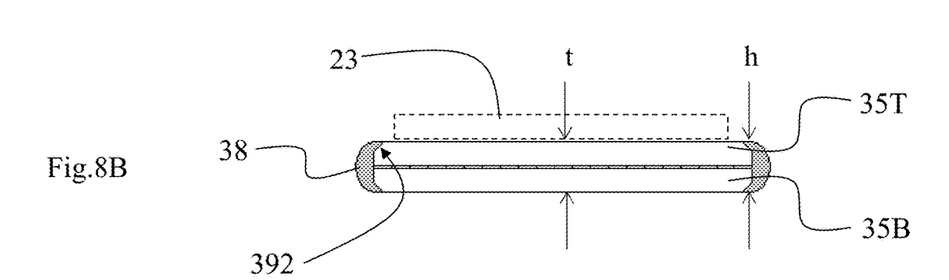
Figure 8C:
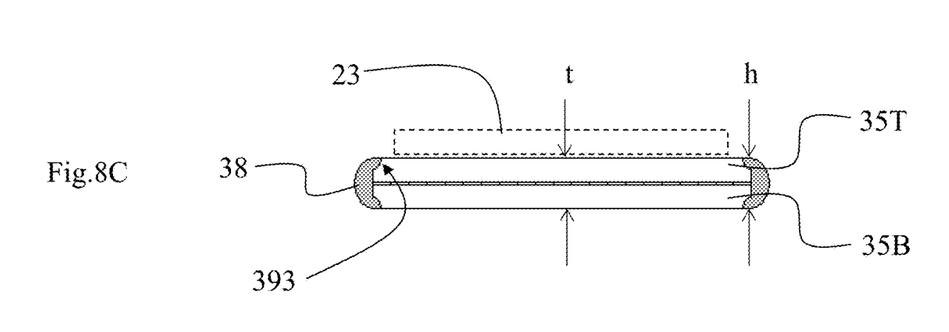

FIGS. 8A~8C show modified embodiments according to the present invention.

FIG. 8A shows polymer 38 wrapping around a peripheral side of the top substrate 35T and the bottom substrate 35B of the composite carrier to enhance the rigidity of the composite substrate. The polymer 38 has a thickness h equivalent to the thickness t of the composite substrate. The polymer 38 protrudes out smoothly in a direction parallel with a surface of the substrate.

FIG. 8B shows a flat chamfer 392 is made on the corner of the substrate 35T, 35B.

FIG. 8C shows a curve chamfer 393 is made on the corner of the substrate 35T, 35B.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A composite carrier for warpage management, comprising:
   a top substrate having opposing top and bottom surfaces, and a side surface located between the top and bottom surfaces of the top substrate;
   a bottom substrate below the top substrate, the bottom substrate having opposing top and bottom surfaces, and a side surface located between the top and bottom surfaces of the bottom substrate;
   an adhesive layer between the top substrate and the bottom substrate, the adhesive layer bonding the top substrate to the bottom substrate, the adhesive layer having opposing top and bottom surfaces, and a side surface located between the top and bottom surfaces of the adhesive layer; and
   a polymer, wrapping around the side surface of each of the top substrate, the bottom substrate and the adhesive layer,
      wherein the polymer has a first portion flush with the top surface of the top substrate, and a second portion flush with the bottom surface of the bottom substrate, the top substrate has a first chamfer extending between the top surface and the side surface of the top substrate, the bottom substrate has a second chamfer extending between the bottom surface and the side surface of the bottom substrate,
      wherein the polymer comprises an inner surface adjacent to and covering the first chamfer, the side surface of the top substrate, the side surface of the adhesive layer, the side surface of the bottom substrate, and the second chamfer,
      wherein the top surface of the top substrate includes an area for semiconductor processing thereon,
      the composite carrier further comprises a multi-layer structure arranged on, and detachable from, the top surface of the top substrate, in the area for semiconductor processing,
      wherein the multi-layer structure comprises a plurality of build-up layers,
         wherein each of the build-up layers comprises a plurality of metal layers embedded in a dielectric layer, and
         wherein adjacent build-up layers are electrically connected,
      one of the top substrate and the bottom substrate is made of a material selected from the group consisting of:
         silicon (Si) having a CTE around 3 ppm,
         cemented carbide having a CTE around 5.5 ppm,
         aluminum (Al) having a CTE around 7.2 ppm,
         titanium (Ti) having a CTE around 8.6 ppm,
         copper clad laminate (CCL) having a CTE around 1~17 ppm,
         aluminum oxide ($Al_2O_3$) having a CTE around 7 ppm,
         aluminum nitride (AlN) having a CTE around 5 ppm, and
         zirconia ($ZrO_2$) having a CTE around 10.5 ppm, and
      the other of the top substrate and the bottom substrate is made of a material selected from the group consisting of:
         silicon (Si) having a CTE around 3 ppm,
         cemented carbide having a CTE around 5.5 ppm,
         aluminum (Al) having a CTE around 7.2 ppm,
         titanium (Ti) having a CTE around 8.6 ppm,
         glass having a CTE around 0~10 ppm,
         copper clad laminate (CCL) having a CTE around 1~17 ppm,
         stainless steel having a CTE around 10~18.0 ppm,
         Alloy 42 having a CTE around 4.8 ppm,
         aluminum oxide ($Al_2O_3$) having a CTE around 7 ppm,
         aluminum nitride (AlN) having a CTE around 5 ppm, and
         zirconia ($ZrO_2$) having a CTE around 10.5 ppm.

2. The composite carrier for warpage management as claimed in claim 1, wherein
   a thickness of the top substrate equals to a thickness of the bottom substrate.

3. The composite carrier for warpage management as claimed in claim 1, wherein
   a thickness of the top substrate is thinner than a thickness of the bottom substrate.

4. The composite carrier for warpage management as claimed in claim 1, wherein
   a thickness of the top substrate is thicker than a thickness of the bottom substrate.

5. The composite carrier for warpage management as claimed in claim 1, wherein
   one of the top substrate and the bottom substrate has a CTE around 1~4 ppm; and the other one has a CTE around 4.5~18 ppm.

6. The composite carrier for warpage management as claimed in claim 1, wherein
   the one of the top substrate and the bottom substrate is made of
      silicon (Si) having a CTE around 3 ppm, and
   the other substrate is made of a material selected from the group consisting of:
      Alloy 42 having a CTE around 4.8 ppm,
      aluminum nitride (AlN) having a CTE around 5 ppm,
      cemented carbide having a CTE around 5.5 ppm,
      aluminum (Al) having a CTE around 7.2 ppm,
      aluminum oxide ($Al_2O_3$) having a CTE around 7 ppm,
      titanium (Ti) having a CTE around 8.6 ppm,
      zirconia ($ZrO_2$) having a CTE around 10.5 ppm,
      glass having a CTE around 0~10 ppm, and
      stainless steel having a CTE around 10~18.0 ppm.

7. The composite carrier for warpage management as claimed in claim 6, wherein
   a thickness of the top substrate equals to a thickness of the bottom substrate.

8. The composite carrier for warpage management as claimed in claim 6, wherein
   a thickness of the top substrate is thinner than a thickness of the bottom substrate.

9. The composite carrier for warpage management as claimed in claim 6, wherein
   a thickness of the top substrate is thicker than a thickness of the bottom substrate.

10. The composite carrier for warpage management as claimed in claim 1, wherein layers in the multi-layer structure have, in combination, a CTE higher than the top substrate.

11. The composite carrier for warpage management as claimed in claim 10, wherein the bottom substrate has a CTE higher than the top substrate.

12. A composite carrier for warpage management, comprising:
- a top substrate having a top surface and a first chamfered edge connected to the top surface, the top surface of the top substrate including an area for semiconductor processing;
- a bottom substrate below the top substrate, the bottom substrate comprising a bottom surface and a second chamfered edge connected to the bottom surface;
- an adhesive layer between the top substrate and the bottom substrate, the adhesive layer bonding the top substrate to the bottom substrate;
- a polymer, comprising a first portion and a second portion respectively flush with the top surface of the top substrate and the bottom surface of the bottom substrate, and the polymer wrapping around the first chamfered edge of the top substrate, a lateral surface of the adhesive layer and the second chamfered edge of the bottom substrate; and
- a multi-layer structure arranged on, and detachable from, the top surface of the top substrate, in the area for semiconductor processing, wherein layers in the multi-layer structure have, in combination, a coefficient of thermal expansion (CTE) higher than the top substrate, the bottom substrate has a CTE higher than the top substrate, the multi-layer structure comprises a build-up layer including a plurality of metal layers embedded in a dielectric layer, and the top substrate is made of a material selected from the group consisting of:
- silicon (Si) having a CTE around 3 ppm,
- cemented carbide having a CTE around 5.5 ppm,
- aluminum (Al) having a CTE around 7.2 ppm,
- titanium (Ti) having a CTE around 8.6 ppm,
- glass having a CTE around 0~10 ppm,
- copper clad laminate (CCL) having a CTE around 1~17 ppm,
- Aluminum oxide ($Al_2O_3$) having a CTE around 7 ppm,
- aluminum nitride (AlN) having a CTE around 5 ppm, and
- zirconia ($ZrO_2$) having a CTE around 10.5 ppm.

13. The composite carrier for warpage management as claimed in claim 12, wherein the adhesive layer is in direct contact with both the top substrate and the bottom substrate, and bonds the top substrate to the bottom substrate, and
a thickness of the adhesive layer is less than a thickness of each of the top substrate and the bottom substrate.

14. The composite carrier for warpage management as claimed in claim 13, wherein the top substrate and the bottom substrate are glass substrates.

* * * * *